United States Patent
Tokunaga et al.

(10) Patent No.: US 9,129,854 B2
(45) Date of Patent: Sep. 8, 2015

(54) FULL METAL GATE REPLACEMENT PROCESS FOR NAND FLASH MEMORY

(71) Applicant: SanDisk Technologies Inc., Plano, TX (US)

(72) Inventors: Kazuya Tokunaga, San Francisco, CA (US); Jongsun Sel, Los Gatos, CA (US); Marika Gunji-Yoneoka, Sunnyvale, CA (US); Tuan Pham, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 127 days.

(21) Appl. No.: 13/645,115

(22) Filed: Oct. 4, 2012

(65) Prior Publication Data

US 2014/0097482 A1  Apr. 10, 2014

(51) Int. Cl.
H01L 21/8238 (2006.01)
H01L 27/115 (2006.01)
H01L 21/28 (2006.01)
H01L 29/66 (2006.01)

(52) U.S. Cl.
CPC .... H01L 27/11524 (2013.01); H01L 21/28273 (2013.01); H01L 29/66825 (2013.01)

(58) Field of Classification Search
CPC ............... H01L 29/66871; H01L 29/66825
USPC ......... 438/211, 183, 184, 176, 257, 258, 288; 257/E21.422, E29.3
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 6,011,725 A | 1/2000 | Eitan | |
| 6,046,935 A | 4/2000 | Takeuchi et al. | |
| 7,655,536 B2 | 2/2010 | Higashitani | |
| 7,951,669 B2 | 5/2011 | Harari et al. | |
| 7,960,266 B2 | 6/2011 | Kai et al. | |
| 8,097,504 B2 | 1/2012 | Mokhlesi et al. | |
| 2003/0008496 A1* | 1/2003 | Deleonibus | 438/630 |
| 2007/0173018 A1* | 7/2007 | Aritome | 438/257 |
| 2009/0080229 A1 | 3/2009 | Chandra Sekar et al. | |
| 2010/0255669 A1* | 10/2010 | Blomiley et al. | 438/591 |
| 2010/0295113 A1* | 11/2010 | Kang et al. | 257/316 |
| 2011/0309425 A1 | 12/2011 | Purayath et al. | |
| 2012/0025289 A1* | 2/2012 | Liang et al. | 257/316 |
| 2012/0049245 A1* | 3/2012 | Bicksler et al. | 257/202 |
| 2012/0187468 A1 | 7/2012 | Liang et al. | |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

Fazio, "Flash Memory Scaling," MRS Bulletin, Nov. 2004, pp. 814-817.

Kwon, "Delving Deep into Micron and Intel's 20-nm 64-Gbit MLC NAND Flash Memory," http://www.eetimes.com/General/PrintView/4369862, Mar. 26, 2012, 3 pages.

* cited by examiner

Primary Examiner — Julia Slutsker
(74) Attorney, Agent, or Firm — Davis Wright Tremaine LLP

(57) ABSTRACT

A NAND flash memory chip is made by forming sacrificial control gate structures and sacrificial select structures, and subsequently replacing these sacrificial structures with metal. Filler structures are formed between sacrificial control gate structures and are subsequently removed to form air gaps between neighboring control gate lines and between floating gates.

18 Claims, 6 Drawing Sheets

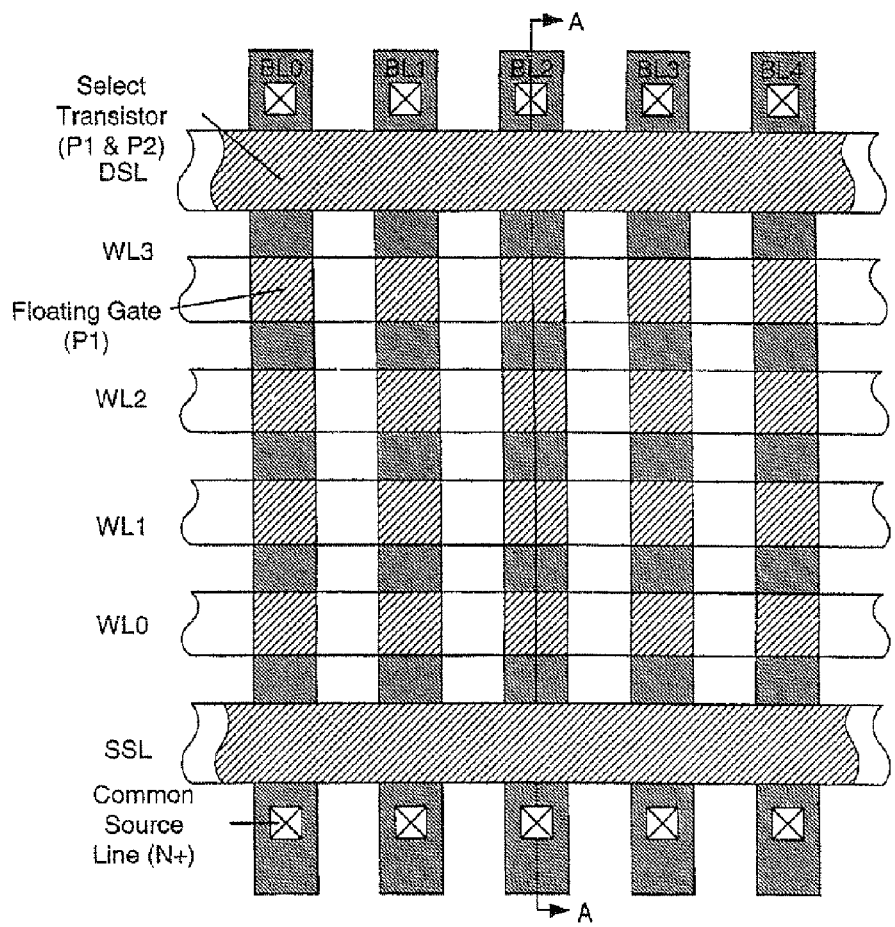
FIG._2A (PRIOR ART)
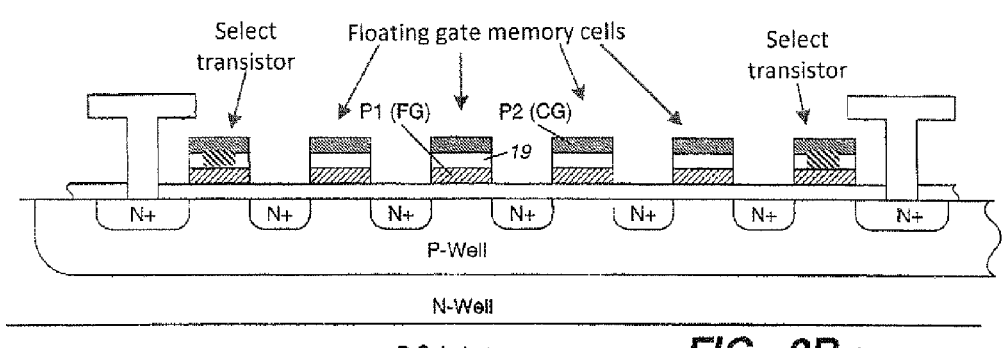
FIG._2B (PRIOR ART)
(Section A-A)

|   |          | Option 1    | Option 2 | Option 3          |
|---|----------|-------------|----------|-------------------|
| A | Material | PSZ (O3 cure) | BSG    | non doped Poly-Si |
|   | Removal  | DHF         | VPC      | DHF then Hot TMY  |
| B | Material | SiN         | SiN      | SiN               |
|   | Removal  | $H_3PO_4$   | $H_3PO_4$ | $H_3PO_4$        |
| C | Material | ALD oxide   | ALD oxide | ALD oxide        |
| D | Material | NSG         | NSG      | NSG               |

FULL METAL GATE REPLACEMENT PROCESS FOR NAND FLASH MEMORY

BACKGROUND OF THE INVENTION

This invention relates generally to non-volatile semiconductor memories of the flash EEPROM (Electrically Erasable and Programmable Read Only Memory) type, their formation, structure and use, and specifically to methods of making NAND memory cell arrays.

There are many commercially successful non-volatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

The top and bottom of the string connect to the bit line and a common source line respectively through select transistors (source select transistor and drain select transistor) in which the floating gate material (P1) is in direct contact with the control gate material (P2) through an opening formed in IPD material. The active gate thus formed is electrically driven from the periphery. Transistors in peripheral circuits are similarly formed by connecting floating gate material, P1, to overlying control gate material, P2, to form an active gate.

Select transistors and peripheral circuits are formed on the same chip as the memory cells but they have very different functions that requite different device structures. Thus, a process that is suitable for forming a memory array may not be suitable for forming peripheral circuits and vice versa. While it may be possible to mask the memory array to perform process steps that affect only peripheral circuits and mask peripheral circuits to perform process steps that affect only the memory array, this increases the number of process steps to manufacture a memory chip. In general, the cost of manufacturing a memory chip increases with the number of processing steps used, and the number of defective units tends to increase also. So it is desirable to use the same process steps for the memory array and peripheral circuits.

Thus, there is a need for a memory chip manufacturing process that forms the memory cells, select transistors, and peripheral circuits in an efficient manner and there is a need for structures that can be formed accordingly.

SUMMARY OF THE INVENTION

An example of a process of forming a NAND flash memory array includes forming sacrificial word line structures and sacrificial select line structures from a sacrificial material such as undoped polysilicon. Sacrificial filler structures fill gaps between sacrificial word line structures. Sacrificial word line and select line structures are removed, and replaced with metal word lines and select lines (with sacrificial filler structures in place). Sacrificial filler structures are later removed to leave air gaps. Sidewall layers protect dielectric and floating gate layers and remain in place throughout replacement of sacrificial structures and removal of sacrificial filler.

An example of a method of forming a NAND flash memory array includes: forming a plurality of sacrificial control gate structures extending in a first direction; forming a plurality of sacrificial filler structures extending in the first direction between sacrificial control gate structures; and subsequently replacing the plurality of sacrificial control gate structures with a plurality of control gate lines while the plurality of sacrificial filler structures remain, an individual control gate line forming a control gate for a memory cell where the control gate line lies in contact with a dielectric layer that overlies a charge storage element.

An individual control gate line may consist of metal. Subsequent to replacing the plurality of sacrificial control gate structures, the plurality of sacrificial filler structures may be removed to leave air gaps extending in the first direction between control gate lines. A sidewall layer may be formed on surfaces of sacrificial control gate structures, the sidewall layer may remain in place during the forming of the plurality of sacrificial filler structures, during the subsequent replacing of the plurality of sacrificial control gate structures, and during the subsequent removing of the plurality of sacrificial filler structures. Subsequent to removing the plurality of sacrificial filler structures, an air gap capping layer may be formed that caps air gaps and isolates air gaps from ambient air. The air gap capping layer may be a Silicon Dioxide layer. A sacrificial select line structure may be formed extending in the first direction and subsequently the sacrificial select line structure may be replaced with a select line. A first sidewall layer may be formed on a first side of the sacrificial select line structure; a second sidewall layer may be formed on a second side of the sacrificial select line structure; the first and second sidewall layers may remain during the subsequent replacing of the sacrificial select line structure. An air gap may be formed adjacent to the first sidewall layer; and a dielectric filled gap may be formed adjacent to the second sidewall layer. Prior to replacing the sacrificial select line structure, an opening may be formed that extends through the sacrificial select line structure and through a dielectric layer that underlies the sacrificial select line structure. The select line may form an electrical contact with charge storage element material through the opening. The method may include forming a plurality of sacrificial peripheral transistor gate structures in a peripheral area of the NAND flash memory array; and subsequently replacing the plurality of sacrificial peripheral transistor gate structures with a plurality of peripheral transistor gates.

An example of a NAND flash memory array includes: a plurality of portions of a dielectric layer individually overlying charge storage elements, the dielectric layer comprising an Oxide-Nitride-Oxide (ONO) stack and a high-K dielectric layer; a plurality of metal control gate lines that directly overlie the dielectric layer portions and that couple to the charge storage elements through the dielectric layer portions; and a plurality of air gaps, an individual air gap separating a first metal control gate line and charge storage elements coupled to the first metal control gate line from a second metal control gate line and charge storage elements coupled to the second metal control gate line.

The high-K dielectric layer may consist of Alumina ($Al_2O_3$). The NAND flash memory array may further include an air gap capping layer that extends over the plurality of air gaps and that isolates the plurality of air gaps from ambient air.

An example of a method of forming a NAND flash memory array includes: forming a plurality of sacrificial control gate structures extending in a first direction; forming a sidewall layer on surfaces of sacrificial control gate structures; forming a plurality of sacrificial filler structures extending in the first direction between sacrificial control gate structures; subsequently replacing the plurality of sacrificial control gate structures with a plurality of metal control gate lines while the plurality of sacrificial filler structures and the sidewall layer remain, an individual metal control gate line forming a control gate for a memory cell where metal of the metal control gate line lies in contact with a dielectric layer that overlies a charge storage element; and subsequently removing the plurality of sacrificial filler structures, without removing the sidewall layer, to leave air gaps extending in the first direction between control gate lines. The method may further include forming a sacrificial select line structure extending in the first direction; forming a select line sidewall layer on the sacrificial select line structure; and subsequently replacing the sacrificial select line structure with a select line while the select line sidewall layer remains.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 2A is a plan view of a prior art NAND array.

FIG. 2B is a cross-sectional view of the prior art NAND array of FIG. 2A taken along the line A-A.

DETAILED DESCRIPTION OF EXEMPLARY EMBODIMENTS

Memory System

Figure 1:
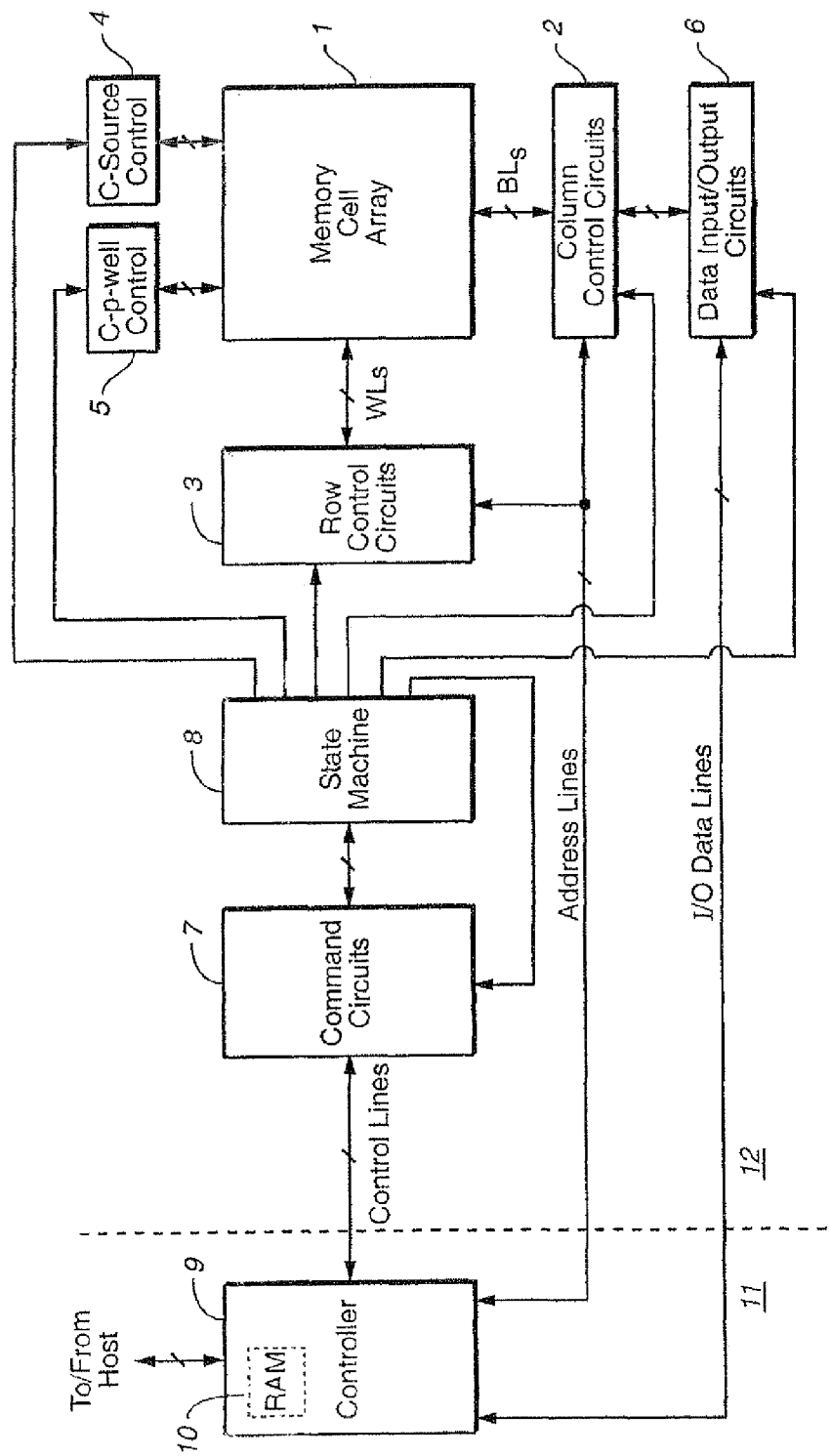
FIG. 1 is a block diagram of a prior art memory system.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertible into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

NAND flash memory arrays such as shown in FIGS. 2A-2B may be formed using a variety of different processes. In order to form extremely small features, a double patterning process may be used to form elements that are smaller than the smallest element that can be formed by direct lithographic patterning. Examples of such double patterning are described in U.S. Pat. Nos. 7,655,536 and 7,960,266.

An example of a process for forming a NAND flash memory array that illustrates some aspects of the present invention will now be described with respect to FIGS. 3-12. It will be understood that additional process steps are performed in fabricating NAND flash memory arrays, and such steps may be performed according to any suitable technique.

Figure 3:
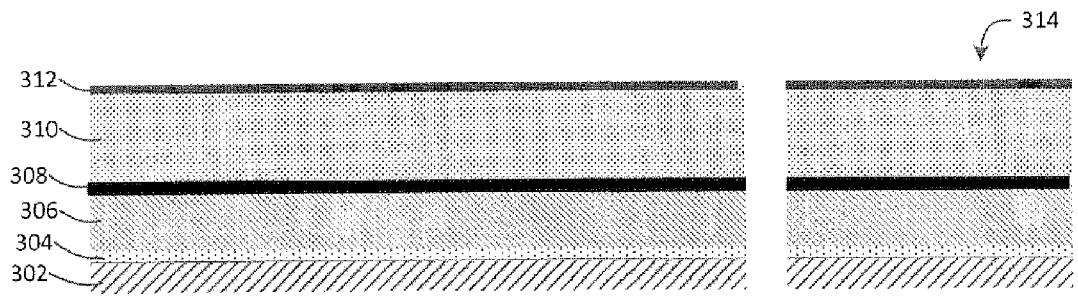
FIG. 3 is a cross section of a NAND flash memory die at an intermediate stage of fabrication, including a portion of the memory array and a peripheral transistor.

FIG. 3 shows a memory die at an intermediate stage of fabrication. Overlying a substrate 302 is a gate dielectric layer 304, which may be Silicon Dioxide or other suitable dielectric. Overlying the gate dielectric layer 304 is a floating gate (FG) layer 306, which may be doped (electrically conductive) polysilicon or metal. In other examples, a charge trapping material may replace the floating gate material. Overlying the floating gate layer 306 is a dielectric layer stack 308, which in this case is a compound layer (or "stack") that consists of multiple layers. The dielectric layer stack 308 in this example uses Silicon Nitride (Nitride, "N") and Silicon Dioxide (Oxide, "O") to form an ONO stack, or NONO stack. On this stack a material having a high dielectric constant, high-k, (e.g. having a higher dielectric constant than Silicon Dioxide) and having a low etch rate is deposited. In this case the high-k material is Alumina ($Al_2O_3$). This layer may be annealed or subject to other post-deposition process steps. For example, Alumina may be annealed after deposition in order to change its material properties so that is more etch resistant (thus providing greater etch selectivity when etching away other materials). The dielectric layer stack serves two purposes in this example: (i) as a dielectric between components that are capacitively coupled, and (ii) as an etch-stop layer. The combination of ONO, or NONO, or other conventional stack, plus an overlying layer of high-k, highly etch resistant material forms a dielectric layer stack that achieves both purposes.

Overlying the dielectric layer 308 is an undoped (nonconductive) polysilicon layer 310 which may be considered a sacrificial layer because it is later replaced and does not remain in the finished product. The polysilicon layer 310 is covered by control gate (GC) hard mask (HM) layer 312. This layer may also act as a Chemical Mechanical Polishing (CMP) stop layer as will be seen later.

The cross section shown in FIG. 3, and subsequent figures, is along the bit-line direction with the word line direction extending perpendicular to the cross section shown (as in FIG. 2B). In this series of drawings, the cross section corresponds to portions of two NAND strings where the NAND strings meet in order to clearly show formation of select lines. Features that are not in the cross section shown (e.g. Shallow Trench Isolation, or "STI" structures between NAND strings) may be formed by any suitable process. Also shown in FIG. 3 is a cross section of a portion of the die 314 that is later formed into a peripheral transistor and includes the same stack of layers as in the memory array area. A peripheral transistor is a conventional transistor (without a floating gate) in a peripheral circuit on the same die as the memory array.

Figure 4:
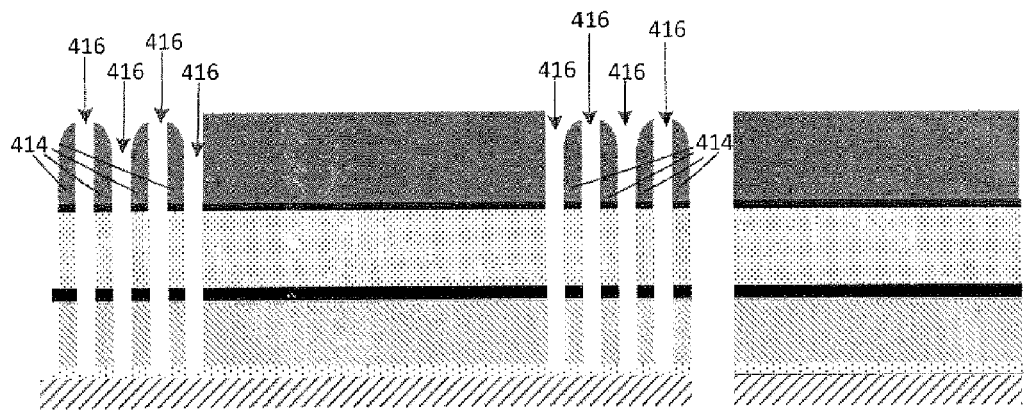
FIG. 4 shows the structure of FIG. 3 after patterning using a hard mask layer.

FIG. 4 shows the structure of FIG. 3 after patterning and etching. In this case, a double patterning process is used to form small masking portions 414 extending perpendicular to the direction shown. These masking portions are then used to establish a pattern for etching the stack of underlying layers, for example, using Reactive Ion Etching (RIE) and wet etching to form openings 416 down to the substrate. These openings 416 separate word lines from each other, and separate floating gates from their neighbors. The structures thus formed under masking portions 414 may be considered word line structures.

Figure 5:
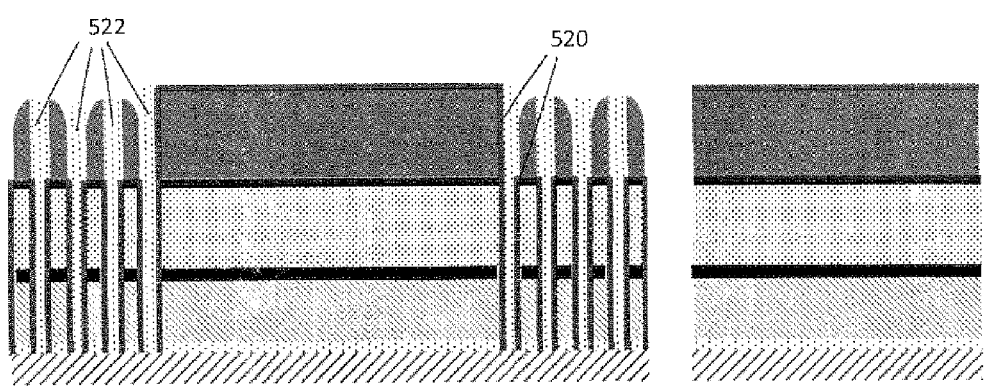
FIG. 5 shows the structure of FIG. 4 after formation of a sidewall layer and sacrificial filler structures.

FIG. 5 shows the structure of FIG. 4 after deposition of a sidewall layer 520 that overlies sidewalls of the word line structures formed in FIG. 4, and after deposition of a sacrificial filler material 522 to fill openings between word line structures and form sacrificial filler structures. For example, the sidewall layer may be a Silicon Dioxide (Oxide) layer formed by Atomic Layer Deposition (ALD), and the sacrificial filler material may be Silicon Nitride.

Figure 6:
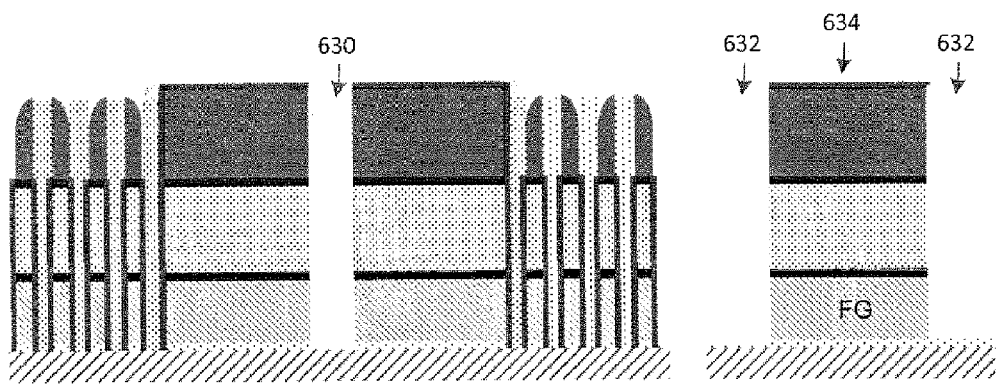
FIG. 6 shows the structure of FIG. 5 after patterning and etching to separate select lines and to define peripheral transistors.

FIG. 6 shows the structure of FIG. 5 after patterning and etching to form an additional opening 630 that separates two select line structures that later form two select lines. In other examples, separation of select lines may be performed in the same step as separating word lines. FIG. 6 also shows the peripheral transistor after the patterning and etching steps. A gate 634 of the peripheral transistor is defined by these steps in this example. Gaps 632 are formed on either side of gate 634 and these gaps define gate 634.

Figure 7:
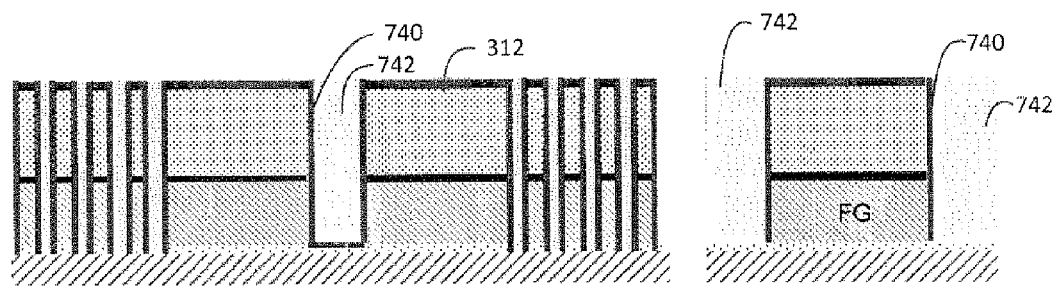
FIG. 7 shows the structure of FIG. 6 after filling gaps between select lines and adjacent to gates of peripheral transistors.

FIG. 7 shows the structure of FIG. 6 after deposition of a second sidewall layer 740 on sidewalls of select line structures, and deposition of Non-doped Silicate Glass (NSG) layer 742 to fill the additional opening. Excess NSG and other material (masking portions etc.) are removed by CMP, stopping on GM HM layer 312, which acts as a CMP stop layer. A suitable CMP process may be used so that when the CMP stop layer is reached, this is detected, and the process may stop automatically. This leaves the planarized top surface shown. NSG layer 742 also fills openings around the gates of peripheral transistors as shown.

Figure 8:
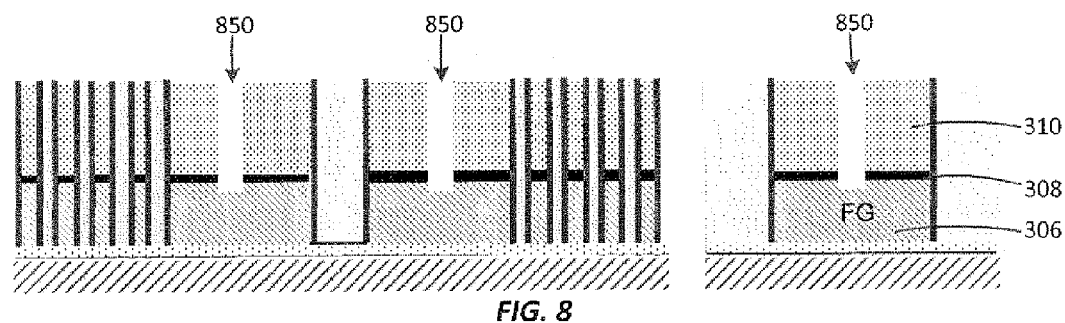
FIG. 8 shows the structure of FIG. 7 after formation of openings in sacrificial structures and dielectric layer to expose underlying floating gate material.

FIG. 8 shows the structure of FIG. 7 after removal of the remaining CMP stop layer 312, and formation of openings 850 in the select line structures. The openings may be formed by a patterning process, followed by anisotropic etching (e.g. RIE). The openings extend down from the planarized top surface, through the entire thickness of the sacrificial undoped polysilicon layer 310 and through the entire thickness of the underlying dielectric layer 308 (ONO and high-k dielectric), and into the underlying floating gate layer 306. Thus, the openings expose a portion of the floating gate layer 306 in each select line structure. Openings 850 are also formed in peripheral transistors by these patterning and etching steps. This exposes the floating gate material 306 in the peripheral transistor in a similar manner to the exposure of floating gate material in the select line structure.

Figure 9:
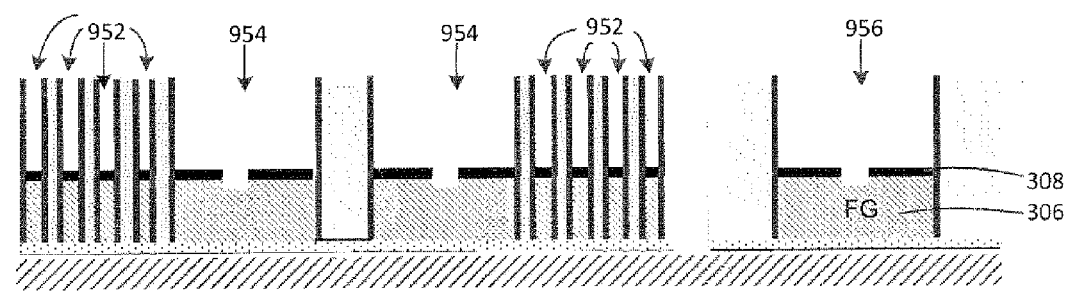
FIG. 9 shows the structure of FIG. 8 after removal of sacrificial structures.

FIG. 9 shows the structure of FIG. 8 after removal of sacrificial undoped polysilicon 310 (e.g. by wet etch). It can be seen that the openings 952 remain where the sacrificial undoped polysilicon material was removed. Openings 952 correspond to control gates (overlying floating gates). Similarly, openings 954 corresponding to select lines (wider openings contacting floating gate material). Thus, the sacrificial undoped polysilicon material 310 may be considered to form sacrificial control gate structures and sacrificial select line structures. Sacrificial undoped polysilicon is also removed from peripheral transistors to leave openings 956 in this step. Openings 952 stop at dielectric layer 308, while openings 954, 956 extended by openings 850 of FIG. 8 extend through dielectric layer 308 into underlying floating gate layer 306.

Figure 10:
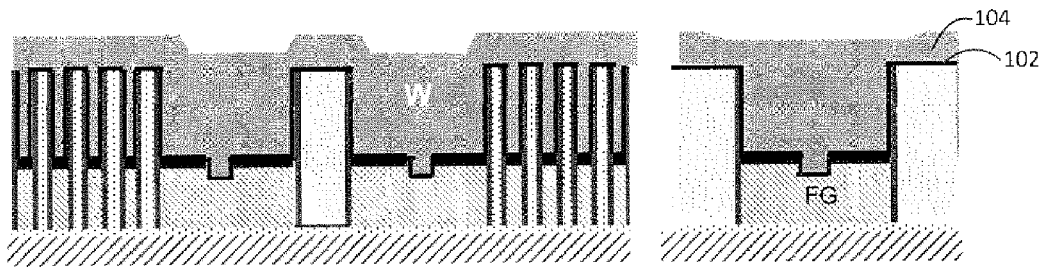
FIG. 10 shows the structure of FIG. 9 after deposition of metal.

FIG. 10 shows the structure of FIG. 9 after a deposition of a barrier material 102 and a metal layer (e.g. Tungsten) 104, so that it covers the substrate and fills openings 952, 954, and 956, where sacrificial structures were removed.

Figure 11:
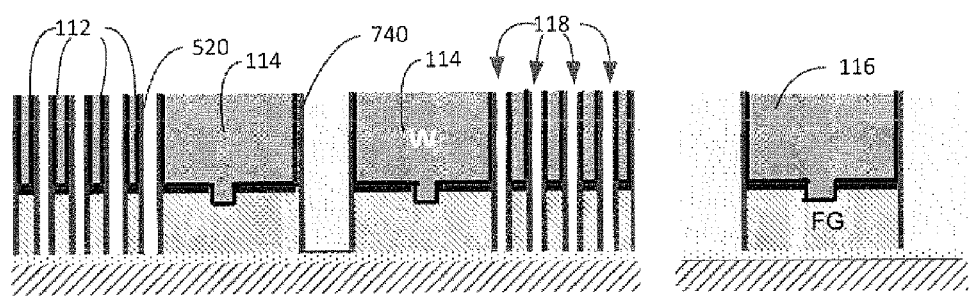
FIG. 11 shows the structure of FIG. 10 after planarization of metal and removal of sacrificial filler structures.

FIG. 11 shows the structure of FIG. 10 after subsequent planarization using CMP, so that metal remains only in openings left from removal of sacrificial structures. Thus, comparing FIG. 8 and FIG. 11, it can be seen that the sacrificial control gate structures, made of undoped polysilicon 310, have been replaced with metal control gate lines 112 (word lines). Also, sacrificial select line structures have been replaced with select lines 114 that contact underlying floating gate material, and sacrificial gate portions of peripheral transistors have been replaced with metal gates 116. While material 306 is referred to as "floating gate material" because it forms floating gates in memory cells, it will be understood that the direct connection between floating gate material and select lines creates a unified gate that is not floating (it is driven by the select line). Similarly, in peripheral transistors, direct connection between metal gate material and floating gate material creates a unified gate that is not floating.

The use of sacrificial place-holder structures that are later replaced with metal allows metal structures to be formed without requiring a metal etch step, which can be problematic, especially where there is a high aspect ratio. For example, etching through a stack that includes metal, to form word lines and select lines may require significant RIE etching that can cause damage to channel regions and other structures, especially high aspect ratio structures such as word line stacks. Collapse of such stacks during RIE is a significant concern.

FIG. 11 also shows the removal of the sacrificial filler structures to create air gaps 118 between word lines and between floating gates (along the bit line direction). It can be seen that sidewall layers 520, 740 remain in place throughout this process, both on sides of control gate lines 112 and select lines 114. These sidewall layers provide protection to portions of the devices (e.g. gate dielectric, channel, floating gate) that might be impacted by later processing (e.g. RIE).

Figure 12:
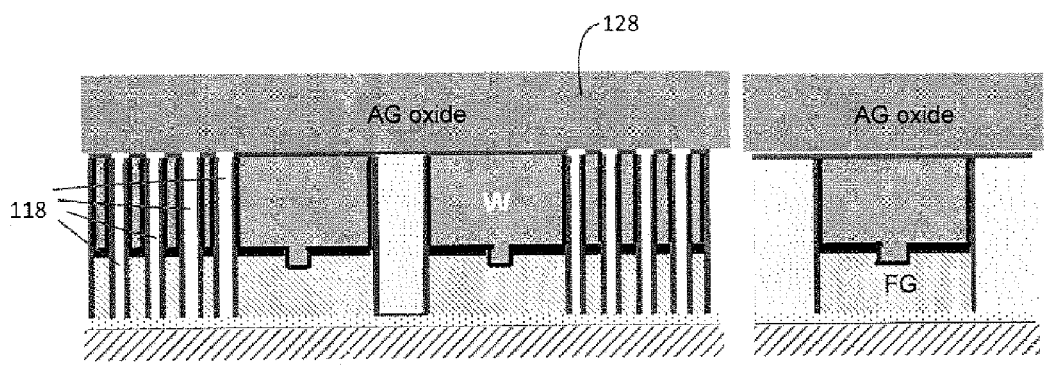
FIG. 12 shows the structure of FIG. 11 after deposition of an air gap capping layer.

FIG. 12 shows the structure of FIG. 11 after formation of an air gap oxide layer 128 that seals air gaps 118 between word lines. Examples of processes for forming such layers are described, for example, in U.S. Patent Publication No. 2011/0309425.

While the above process gives specific materials and specific process conditions, it will be understood that the present invention is not limited to any particular material, or specific process condition. For example, floating gate material may be replaced with charge trapping material.

Figures 13, 14:
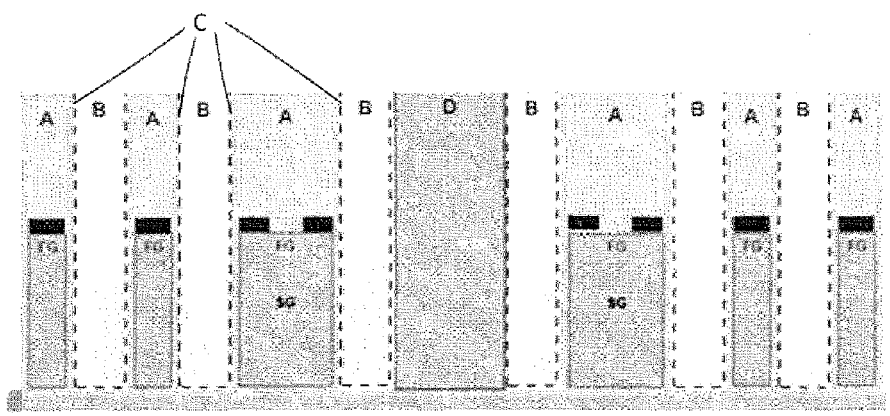
FIG. 13 shows a generic cross section of a portion of a NAND array.
FIG. 14 shows examples of materials that may be used in the NAND array of FIG. 13.

FIG. 13 shows a more generic cross section of a NAND flash memory at an intermediate stage of fabrication. Portions marked "A" correspond to the undoped polysilicon portions discussed above (sacrificial control gate structures and sacrificial select line structures). Portions marked "B" correspond to the sacrificial filler structures discussed above. Portions marked "C" (indicated by dashed lines) correspond to sidewall layers discussed above. The portion marked "D" corresponds to the NSG filling between sacrificial select lines discussed above. Specific sacrificial materials may be chosen based on their suitability based on particular characteristics for example etch selectivity (i.e. whether a suitable etch chemistry is available to allow removal with little impact on adjacent materials). In particular, etch selectivity between material A and floating gate material (e.g. polysilicon), etch selectivity between material A and material B, and etch selectivity between material B and the metal of the control gate (e.g. Tungsten), may be factors in selecting these materials.

FIG. 14 shows some options that may be used in different embodiments. The materials discussed above are given as option 3. Option 1 includes using polysilazane (PSZ) instead of undoped polysilicon to form sacrificial control gate lines and select lines. Option 2 includes using Boron Silica Glass (BSG) to form sacrificial control lines and select lines. Other materials may also be chosen based on their etch characteristics or other properties.

CONCLUSION

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of forming a NAND flash memory array comprising:
   forming a plurality of sacrificial control gate structures extending in a word line direction, an individual sacrificial control gate structure lying in direct contact with a dielectric layer that overlies a charge storage element;
   forming a plurality of sacrificial filler structures extending in the word line direction between sacrificial control gate structures; and
   subsequently replacing the plurality of sacrificial control gate structures with a plurality of control gate lines that extend in the word line direction while the plurality of sacrificial filler structures remain initially between the sacrificial control gate structures and subsequently between the control gate lines, the charge storage element, and the dielectric layer that overlies the charge storage element remain, an individual control gate line forming a control gate for a memory cell where the individual control gate line lies in direct contact with the dielectric layer that overlies the charge storage element.

2. The method of claim 1 wherein an individual control gate line consists of metal.

3. The method of claim 1 further comprising, subsequent to replacing the plurality of sacrificial control gate structures, removing the plurality of sacrificial filler structures to leave air gaps extending in the first word line direction between control gate lines.

4. The method of claim 3 further comprising forming a sidewall layer at first locations on surfaces of sacrificial control gate structures, wherein the sidewall layer remains in place at the first locations during the forming of the plurality of sacrificial filler structures, during the subsequent replacing of the plurality of sacrificial control gate structures, and during the subsequent removing of the plurality of sacrificial filler structures.

5. The method of claim 3 further comprising, subsequent to removing the plurality of sacrificial filler structures, forming an air gap capping layer that caps the air gaps extending in the word line direction between control gates and isolates the air gaps from ambient air.

6. The method of claim 5 wherein the air gap capping layer is a Silicon Dioxide layer.

7. The method of claim 1 further comprising forming a sacrificial select line structure extending in the word line direction and subsequently replacing the sacrificial select line structure with a select line.

8. The method of claim 7 further comprising:
  forming a first sidewall layer on a first side of the sacrificial select line structure;
  forming a second sidewall layer on a second side of the sacrificial select line structure; and
  wherein first and second sidewall layers remain during the subsequent replacing of the sacrificial select line structure.

9. The method of claim 8 further comprising:
  forming an air gap in contact with the first sidewall layer; and
  forming a dielectric filled gap in contact with the second sidewall layer.

10. The method of claim 7 further comprising, prior to replacing the sacrificial select line structure, forming an opening that extends through the sacrificial select line structure and through a dielectric layer that underlies the sacrificial select line structure.

11. The method of claim 10 wherein the select line forms an electrical contact with charge storage element material through the opening.

12. The method of claim 1 further comprising:
  forming a plurality of sacrificial peripheral transistor gate structures in a peripheral area of the NAND flash memory array; and
  subsequently replacing the plurality of sacrificial peripheral transistor gate structures with a plurality of peripheral transistor gates.

13. A method of forming a NAND flash memory array comprising:
  forming a plurality of sacrificial control gate structures extending in a first direction, an individual sacrificial control gate structure lying in contact with a dielectric and etch-stop layer that overlies a charge storage element;
  forming a sidewall layer on surfaces of sacrificial control gate structures;
  forming a plurality of sacrificial filler structures extending in the first direction between sacrificial control gate structures;
  subsequently removing the plurality of sacrificial control gate structures by etching down to the dielectric and etch-stop layer without substantially etching the plurality of sacrificial filler structures;
  subsequently depositing metal directly on the dielectric and etch-stop layer to form a plurality of metal control gate lines while the plurality of sacrificial filler structures and the sidewall layer remain to separate adjacent metal control gate lines, an individual metal control gate line forming a control gate for a memory cell where metal of the individual metal control gate line lies in contact with the dielectric and etch-stop layer that overlies the charge storage element; and
  subsequently removing the plurality of sacrificial filler structures, without removing the sidewall layer, to leave air gaps extending in the first direction between control gate lines.

14. The method of claim 13 further comprising forming a sacrificial select line structure extending in the first direction;
  forming a select line sidewall layer on the sacrificial select line structure; and
  subsequently replacing the sacrificial select line structure with a select line while the select line sidewall layer remains.

15. The method of claim 13 wherein the dielectric and etch-stop layer is formed as a dielectric layer stack that includes an uppermost layer of a high-k dielectric material.

16. The method of claim 15 wherein the high-k dielectric material is Alumina ($Al_2O_3$).

17. The method of claim 13 wherein forming the plurality of metal control gate lines includes planarizing the deposited metal to leave the metal control gate lines only at locations previously occupied by sacrificial control gate structures.

18. The method of claim 13 wherein, subsequent to depositing the metal, the metal is not etched.

* * * * *

UNITED STATES PATENT AND TRADEMARK OFFICE
CERTIFICATE OF CORRECTION

PATENT NO. : 9,129,854 B2  
APPLICATION NO. : 13/645115  
DATED : September 8, 2015  
INVENTOR(S) : Tokunaga et al.

Page 1 of 1

It is certified that error appears in the above-identified patent and that said Letters Patent is hereby corrected as shown below:

In the Claims

Column 8, line 63, please delete "first."

Signed and Sealed this  
Third Day of May, 2016

Michelle K. Lee  
*Director of the United States Patent and Trademark Office*